(12) United States Patent
Levesque et al.

(10) Patent No.: US 7,983,038 B2
(45) Date of Patent: Jul. 19, 2011

(54) EQUIPMENT RACK AND ASSOCIATED VENTILATION SYSTEM

(75) Inventors: Stewart A. Levesque, Scotland, CT (US); Lars R. Larsen, Old Lyme, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 12/468,407

(22) Filed: May 19, 2009

(65) Prior Publication Data

US 2009/0237880 A1 Sep. 24, 2009

Related U.S. Application Data

(63) Continuation-in-part of application No. 11/942,298, filed on Nov. 19, 2007.

(51) Int. Cl.
*H05K 7/20* (2006.01)
*H05K 5/00* (2006.01)
*G06F 1/20* (2006.01)

(52) U.S. Cl. ........... 361/692; 361/679.5; 361/679.51; 361/690; 361/716; 211/26; 312/223.2; 312/236; 454/184

(58) Field of Classification Search ............. 361/679.46, 361/679.48–679.51, 690, 692, 694–695, 361/715–716; 211/26; 312/223.2, 236; 454/184
See application file for complete search history.

(56) References Cited

U.S. PATENT DOCUMENTS

| | | | |
|---|---|---|---|
| 3,010,706 A | | 11/1961 | Mcwilliams |
| 3,874,444 A | * | 4/1975 | Perce et al. ............ 165/47 |
| 4,407,187 A | | 10/1983 | Horney |

(Continued)

OTHER PUBLICATIONS

PCT International Search Report and Written Opinion dated Jul. 14, 2010 (8 pages).

(Continued)

*Primary Examiner* — Robert J Hoffberg
(74) *Attorney, Agent, or Firm* — McCarter & English, LLP

(57) ABSTRACT

A cable management rack is provided within which or upon which a heat-generating device is mountable, and which encompasses a vertical rectangular frame open in a front and a rear of the frame. The rack includes a first upright and a second upright attached to opposite respective lateral sides of a base and a top member, and respective side-facing panels. Each of the panels defines a plurality of vent holes arranged in an array and permit the rack to receive a sideways flow of cooling air into a first side of the rack through one of the vent hole arrays for cooling a heat-generating device mounted between the panels, and permit the rack to discharge a sideways flow of exhaust air through the other vent hole array. Each of the array of vent holes may manifest a honeycomb pattern of vent holes, and each of the vent holes may manifest an hexagonal shape. A cable management system includes a cable management rack for accommodating a heat generating device, a first baffle mounted with respect to a first upright of the rack and for redirecting a rearward flow of cool air sideways from a space adjacent a front side of the rack, and a second baffle mounted with respect to a second upright of the rack and for redirecting a sideways flow of exhaust air from the rack and through the second upright into a space adjacent a rear side of the rack. A method of cooling a heat-generating device mounted in or on a cable management rack includes providing a sideways flow of cooling air into the rack and into the device.

7 Claims, 7 Drawing Sheets

U.S. PATENT DOCUMENTS

| | | | |
|---|---|---|---|
| 4,726,285 | A | 2/1988 | Kelley |
| 4,758,925 | A * | 7/1988 | Obata et al. .................. 361/695 |
| 4,785,925 | A | 11/1988 | Frisbie et al. |
| 5,063,477 | A * | 11/1991 | Paggen et al. ................. 361/695 |
| 5,201,879 | A | 4/1993 | Steele |
| 5,307,942 | A | 5/1994 | Quelfeter et al. |
| 5,528,454 | A * | 6/1996 | Niklos .......................... 361/695 |
| 5,540,339 | A | 7/1996 | Lerman |
| D385,958 | S | 11/1997 | Higashino et al. |
| 5,721,670 | A * | 2/1998 | Cochrane et al. ............. 361/695 |
| 5,910,639 | A | 6/1999 | Kunkel |
| 5,914,858 | A | 6/1999 | McKeen et al. |
| 5,934,485 | A | 8/1999 | Harris et al. |
| 5,969,942 | A | 10/1999 | Heckner et al. |
| 5,991,163 | A | 11/1999 | Marconi et al. |
| 6,181,557 | B1 | 1/2001 | Gatti |
| 6,454,646 | B1 | 9/2002 | Helgenberg et al. |
| 6,702,125 | B2 | 3/2004 | Hartel |
| 6,717,807 | B2 | 4/2004 | Hikawa |
| 6,719,150 | B2 | 4/2004 | Marraffa |
| 6,888,069 | B1 | 5/2005 | Chen et al. |
| 6,914,779 | B2 | 7/2005 | Askeland et al. |
| 6,924,979 | B2 | 8/2005 | Clements et al. |
| 6,932,443 | B1 | 8/2005 | Kaplan et al. |
| 7,026,553 | B2 | 4/2006 | Levesque et al. |
| 7,215,543 | B2 | 5/2007 | Arbogast et al. |
| 7,385,810 | B2 | 6/2008 | Chu et al. |
| D578,633 | S | 10/2008 | Schluter et al. |
| 7,438,638 | B2 | 10/2008 | Lewis et al. |
| 7,499,273 | B2 | 3/2009 | Casebolt |
| 7,522,414 | B2 | 4/2009 | Karstens |
| 7,611,799 | B2 | 11/2009 | Marraffa |
| 2002/0046979 | A1 | 4/2002 | Larsen et al. |
| 2005/0135075 | A1 | 6/2005 | Deng |
| 2006/0043031 | A1 | 3/2006 | Rinderer |
| 2006/0232945 | A1 | 10/2006 | Chu et al. |
| 2006/0243680 | A1 | 11/2006 | Levesque et al. |
| 2007/0183129 | A1 | 8/2007 | Lewis et al. |
| 2009/0308033 | A1 | 12/2009 | Eckberg et al. |

OTHER PUBLICATIONS

PCT International Search Report dated Jan. 29, 2009 (3 pages).
PCT Written Opinion dated Jan. 29, 2009 (6 pages).
Might Mo® 6, Product Specification, Ortronics.
Cisco Catalyst 6513 Switch, Product Specification, Cisco.
Engineering Drawing for Project: D-4 Bay 23 Baffles; Title: Bay 23, Drawing No. H-1, Atkinson Koven Feinberg Engineers, dated Jan. 28, 2000 (submitted in color to facilitate review of green verbiage).

* cited by examiner

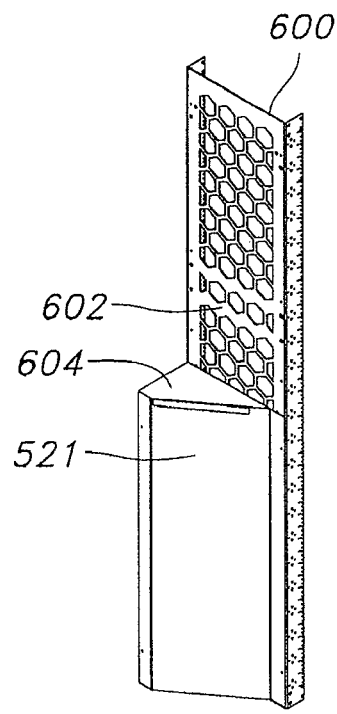 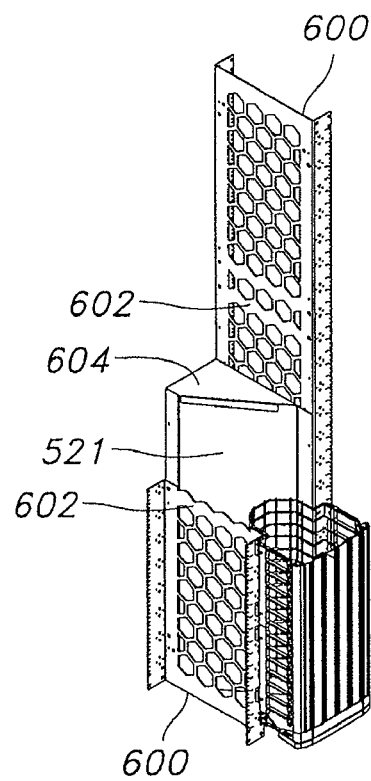
FIG. 6   FIG. 7
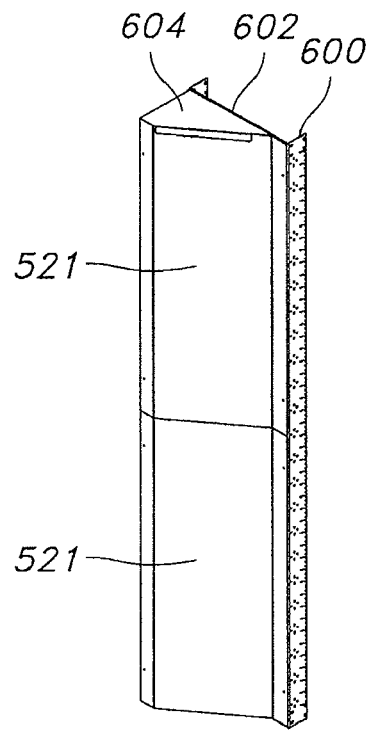 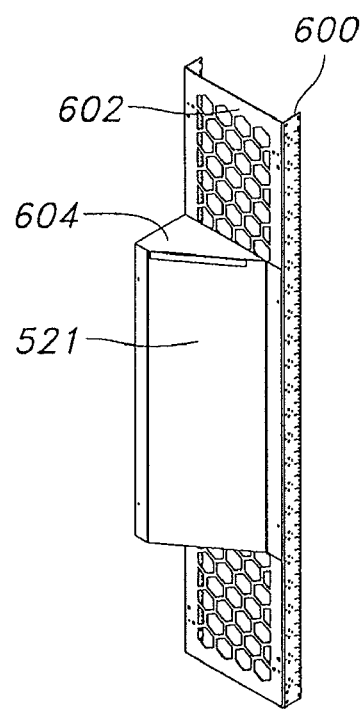
FIG. 8   FIG. 9

Fan assembly

EQUIPMENT RACK AND ASSOCIATED VENTILATION SYSTEM

CROSS REFERENCE TO RELATED APPLICATIONS

This application is a continuation-in-part of U.S. patent application Ser. No. 11/942,298, filed Nov. 19, 2007, the contents of which are herein incorporated by reference.

BACKGROUND

1. Technical Field

The present disclosure is directed generally to rack systems for use in positioning of electronic components and/or equipment and, more particularly, to cable management racks and equipment ventilation systems associated therewith.

2. Background Art

Cable management systems (such as cable racks, bays or frames, which are hereinafter referred to as "racks") have long been used in many varied applications, such as in communications and electronic services, and are generally located in indoor rooms, closures, offices or controlled environmental vaults. A known common construction that has evolved for such racks is one shown in FIG. 1 in the form of a rack 100. The rack 100 encompasses a tall, rectangular frame, typically constructed with two uprights 102 attached to a base 104 and a top member 106, the latter commonly incorporating a waterfall 108 useful for ensuring that appropriately large bend radii are formed in cables extending to, from, and along the top member 108, as discussed in greater detail below. Referring now to FIG. 2, an arrangement 200 includes two instances of a cable management rack that may be substantially similar to the rack 100 of FIG. 1, including a rack 202 and a rack 204, the racks 202 and 204 being positioned adjacent to each other in a side-by-side configuration and including respective waterfalls 206, 208. Also included in the arrangement 200 are three instances of a conventional cable management cage, a first of which, a cage 210, is somewhat larger than the others and is positioned between the rack 202 and the rack 204, a second of which, a cage 212, is somewhat smaller and is positioned on an opposite side of the rack 202 from the cage 210, and a third of which, a cage 214, is approximately the same size as the cage 212 and is positioned on an opposite side of the rack 204 from the cage 210. The arrangement 200 further includes a variety of devices, e.g., a device 216 and a device 218 mounted within the rack 202 (e.g., wherein the device 216 is a patch panel, and a device 220 and a device 222 mounted within the rack 204, and a variety of cables 224 extending vertically within the cages 210, 212, 214, forming a variety of bend radii (e.g., a bend radius 226 associated with the waterfall 206), extending horizontally inward across the respective fronts of the racks 202, 204, and interconnecting with the various devices (e.g., the devices 216, 218, 220, 222) mounted within the racks 202, 204. The arrangement 200 still further includes a corresponding variety of cables 226 interconnecting with the various devices mounted within the racks 202, 204, extending horizontally outward across the respective rears of the racks 202, 204, and extending vertically within the cages 210, 212, 214.

The devices mounted within the racks 202, 204 may be cross connect panels, patch panels, or any one of a variety of other types of devices requiring the orderly accomplishment of cable interconnections. In many instances, a rack mounted device, such as the device 218, requires a supply of cool air to ensure that a moderate operating temperature is maintained within the device. For example, the device 218 includes a pair of fan-equipped vents 228 facing outward of the device 218 and visible from a front side 230 of the rack 202 such that the device 218 receives a supply of cool air directly from a space or corridor defined at least in part by a corresponding front side of the arrangement 200. In such circumstances, the device 218 typically further includes one or more exhaust vents (obscured) facing outward of the device 218 and visible from a rear side 232 of the rack 202 opposite the front side 230 thereof such that the device 218 vents warm exhaust air directly into a space or corridor defined at least in part by a corresponding rear side of the arrangement 200.

A prior art arrangement 300 shown in FIG. 3 includes multiple instances of a cable management rack similar to the cable management racks 100, 202, 204 of FIGS. 1 and 2, including a rack 302, a rack 304, and a rack 306, an instance of a cable management cage similar to the cage 210 of FIG. 2 (cage 308 disposed between the rack 302 and the rack 304), and an instance of a cable management cage similar to the cages 212 and 214 of FIG. 2 (cage 310 disposed between the rack 304 and the rack 306). A space or corridor 312 defined at least in part by a front side 314 of the arrangement 300 includes a supply of cool air for cooling such devices (not shown for the sake of convenience) as are mounted in the racks 302, 304, 306 of the arrangement 300. As shown by respective flows of cool air indicated at 316, 318 and 320, the cooling air enters the devices (not shown) mounted in the racks 302, 304, 306 of the arrangement 300 via the front side 314 of the arrangement 300 adjacent the corridor 312. A space or corridor 322 is defined at least in part by a rear side 324 of the arrangement 300, and as shown by respective flows of warm exhaust air indicated at 326, 328, and 330, the resulting warm exhaust air exits the devices (not shown) mounted in the racks 302, 304, 306 of the arrangement 300 via the rear side 324 of the arrangement 300 adjacent the corridor 322.

As described above, the ventilation arrangements depicted in FIGS. 2 and 3 are appropriate for purposes of cooling devices configured to receive cooling air approaching such devices from directly in front of the arrangements 200, 300 and to expel warm exhaust air by passing such warm air directly to the rear of the arrangements 200, 300. Despite efforts to date, a need remains for racks and associated ventilation arrangements and systems designed to deliver cooling air to, and to eliminate warm exhaust air from, devices mounted within such racks in a more effective and/or reliable manner. These and other needs are satisfied by the racks and associated ventilation systems disclosed herein.

SUMMARY

In accordance with embodiments of the present disclosure, cable management racks, associated ventilation systems, and related techniques are disclosed for providing sideways-directed flows of cooling air into such racks and into heat-generating devices mounted therein (or thereon), and for facilitating the passage of sideways-directed flows of exhaust air outward of such devices and out of such racks. The disclosed racks, ventilation systems, and techniques facilitate redirection of cooling flows from spaces or corridors positioned adjacent to respective front sides of such racks sideways into such racks and into (and/or alongside) such heat-generating devices, and further facilitate redirection of exhaust flows from such devices and from such racks rearward into spaces or corridors positioned adjacent to respective rear sides of such racks.

In accordance with embodiments of the present disclosure, a cable management rack is provided within or upon which a heat-generating device is mountable, and which encompasses a vertical rectangular frame open in a front and a rear of the frame. The rack further includes a first upright and a second upright attached to opposite respective lateral sides of a base and a top member. The rack still further includes respective side-facing panels. According to exemplary embodiments of the present disclosure, each of the respective side-facing panels advantageously defines a respective corresponding plurality of vent holes arranged in an array and effective to permit the rack to receive a straight lateral sideways flow of cooling air into a first side of the rack through one of the vent hole arrays for cooling a heat-generating device mounted between the side-facing panels, and to permit the rack to discharge a corresponding straight lateral sideways flow of exhaust air through the other of the vent hole arrays. With respect to each respective side-facing panel, the respective corresponding plurality of vent holes may extend across a predominant portion of a side-facing surface area of the side-facing panel, may extend across substantially an entire height of the rack, and/or may extend across substantially an entire depth of the rack. Further with respect to each respective plurality of vent holes, the array thereof may manifest a honeycomb pattern, and/or each of the vent holes thereof may manifest an hexagonal shape, and/or a punched hole perforating the respective side-facing panel.

In an alternate embodiment of the present disclosure, either or each of the respective side facing panels advantageously defines an integral baffle. If both side facing panels possess an integral baffle, they may be arranged with respective integral baffles extending from diagonally opposing uprights of the side facing panels. The integral baffles are generally angularly oriented relative to the substantially rectangular rack and are effective to permit the rack to receive a lateral sideways flow of cooling air into a first side of the rack through one of the cavities defined by a first integral baffle, and to permit the rack to discharge a corresponding (or substantially corresponding) lateral sideways flow of exhausting air through the other cavity defined by the other integral baffle.

In accordance with embodiments of the present disclosure, a cable management system is provided, the system being operable to deliver a supply of cooling air to a heat generating device mounted therewithin (and/or thereon), and including a cable management rack for accommodating a heat-generating device, the rack encompassing a vertical rectangular frame open in a front and a rear of the frame and including first and second uprights attached to opposite respective lateral sides of a base and a top member, a first baffle mounted with respect to or integrally extending from the first upright and configured and dimensioned to redirect a rearward flow of cool air from a space adjacent a front side of the rack sideways through the first upright, and a second baffle mounted with respect to or integrally extending from the second upright and configured and dimensioned to redirect a sideways flow of exhaust air from the rack and through the second upright rearward into a space adjacent a rear side of the rack.

The cable management system may further include (i) a third baffle mounted with respect to or integrally extending from the first upright in vertical alignment with the first baffle and configured and dimensioned to redirect a second, separate rearward flow of cool air from the space adjacent the front side of the rack sideways through the first upright, and (iv) a fourth baffle mounted with respect to or integrally extending from the second upright in vertical alignment with the third baffle and configured and dimensioned to redirect a second, separate sideways flow of exhaust air from the rack and through the second upright rearward into a space adjacent a rear side of the rack.

Also, the cable management system may include a second cable management rack for accommodating heat-generating device(s), the second cable management rack encompassing a vertical rectangular frame open in a front and a rear of the frame and including first and second uprights attached to opposite respective lateral sides of a base and a top member, and a third cable management rack for accommodating a heat-generating device, the third cable management rack encompassing a vertical rectangular frame open in a front and a rear of the frame and including first and second uprights attached to opposite respective lateral sides of a base and a top member, wherein a first baffle is further mounted with respect to or integrally extending from the second upright of the second rack and is configured and dimensioned to redirect a second sideways flow of exhaust air from the second rack and through the second upright thereof rearward into the space adjacent the rear side of the rack, and a second baffle is mounted with respect to or integrally extending from the first upright of the third rack and is configured and dimensioned to redirect a second rearward flow of cool air from the space adjacent the front side of the rack sideways through the first upright thereof.

In accordance with embodiments of the present disclosure, a method is provided for cooling a heat-generating device mounted in (or on) a cable management rack encompassing a vertical rectangular frame open in a front and a rear of the frame and including respective first and second uprights attached to opposite respective lateral sides of a base and a top member, the method including receiving a rearward flow of cool air from a space adjacent a front side of the rack and redirecting the flow of cool air sideways through the first upright and into the heat-generating device, and redirecting a sideways flow of exhaust air passing out of the heat-generating device, and through the second upright, rearward to a space adjacent a rear side of the rack. The method may further include receiving another rearward flow of cool air from the space adjacent the front side of the rack and redirecting the another rearward flow of cool air sideways through the first upright and into a second heat-generating device mounted in the rack, and redirecting another sideways flow of exhaust air passing out of another heat-generating device, and through the second upright, rearward to the space adjacent the rear side of the rack.

Additional features, functions and benefits of the disclosed racks, ventilation systems, and associated methods and techniques will be apparent from the detailed description which follows, particularly when read in conjunction with the appended figures.

BRIEF DESCRIPTION OF FIGURES

To assist those of skill in the art in making and using the disclosed equipment mounting racks and associated ventilation systems, wherein:

FIGS. 6, 7, 8, and 9 are views of corresponding portions of respective first, second, third, and fourth variations of the arrangement of FIG. 5 illustrating different placement positions for and quantities of the baffles disposed between the ventilated uprights of respective racks;

DESCRIPTION OF EXEMPLARY EMBODIMENT(S)

Figure 1:
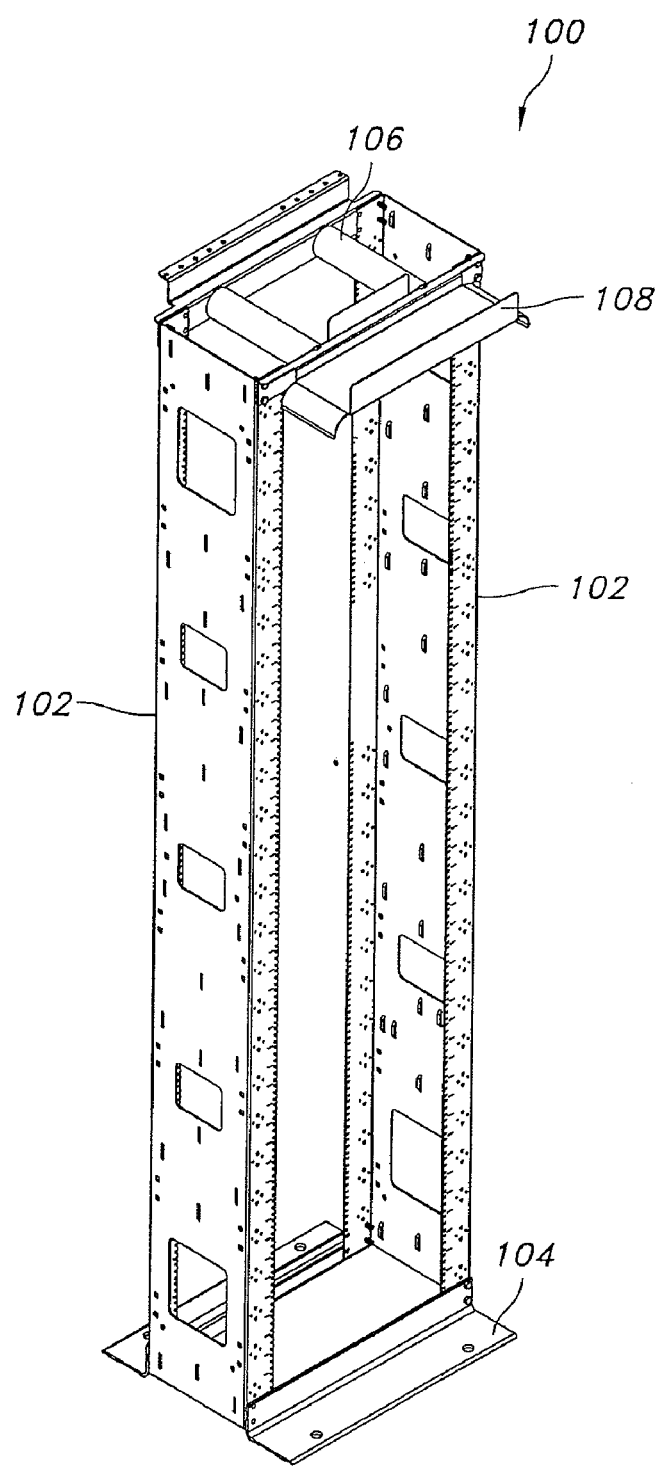
FIG. 1 is a perspective side view of a known cable management rack.
Figure 2:
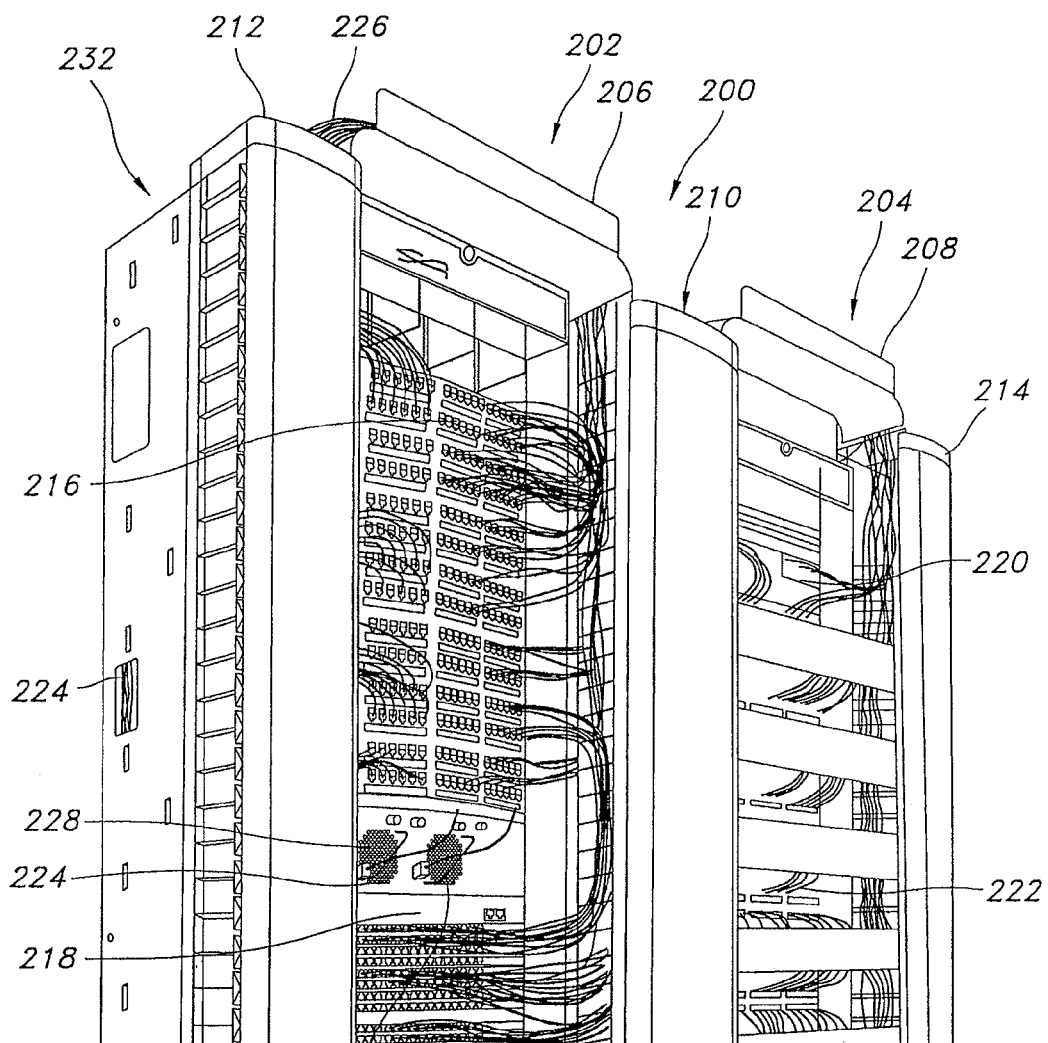
FIG. 2 is a partial perspective side view of a known arrangement of cable management racks, cable management cages, devices mounted in the racks, and cables mounted with respect to the racks and cages and interconnected with the devices.
Figure 3:
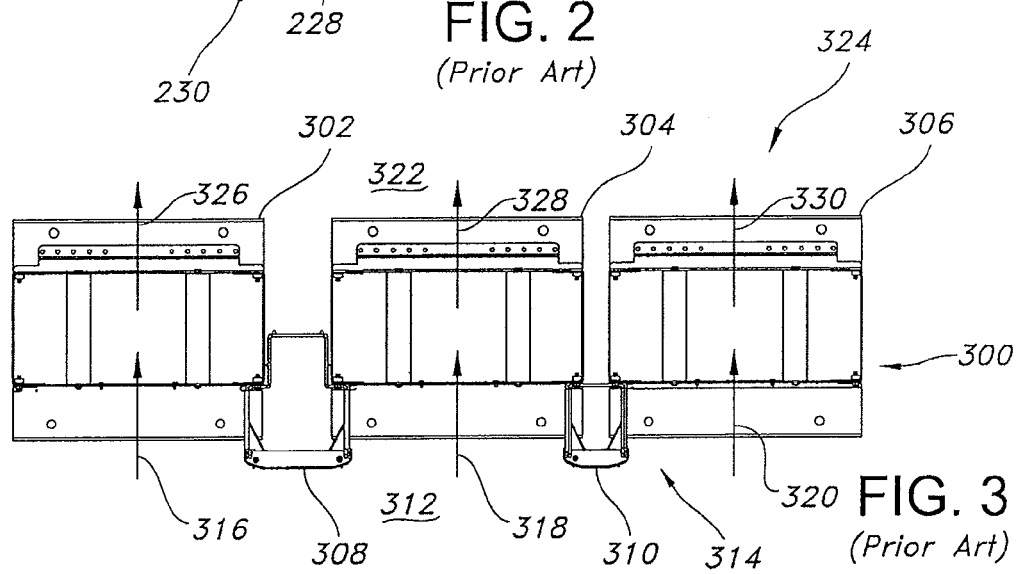
FIG. 3 is a schematic plan view of a known arrangement of cable management racks and cable management cages illustrating conventional flows for receiving cooling air from a corridor adjacent a front side of the arrangement directly into devices mounted in the racks, and for discharging warm exhaust air from the mounted devices directly into a corridor adjacent a rear side of the arrangement.
Figure 4:
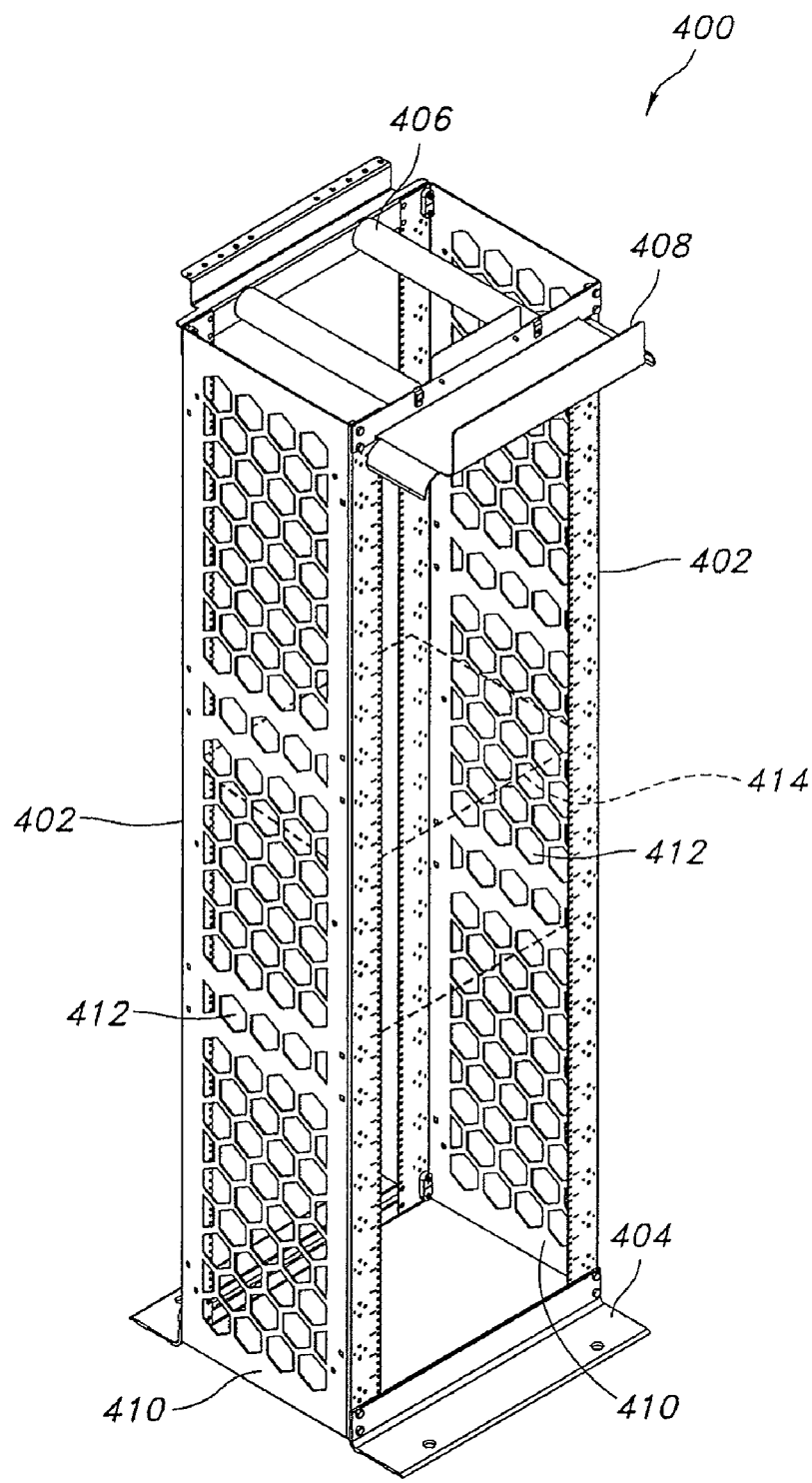
FIG. 4 is a perspective side view of a cable management rack incorporating respective uprights having ventilated side panels in accordance with embodiments of the present disclosure.
Figure 10:
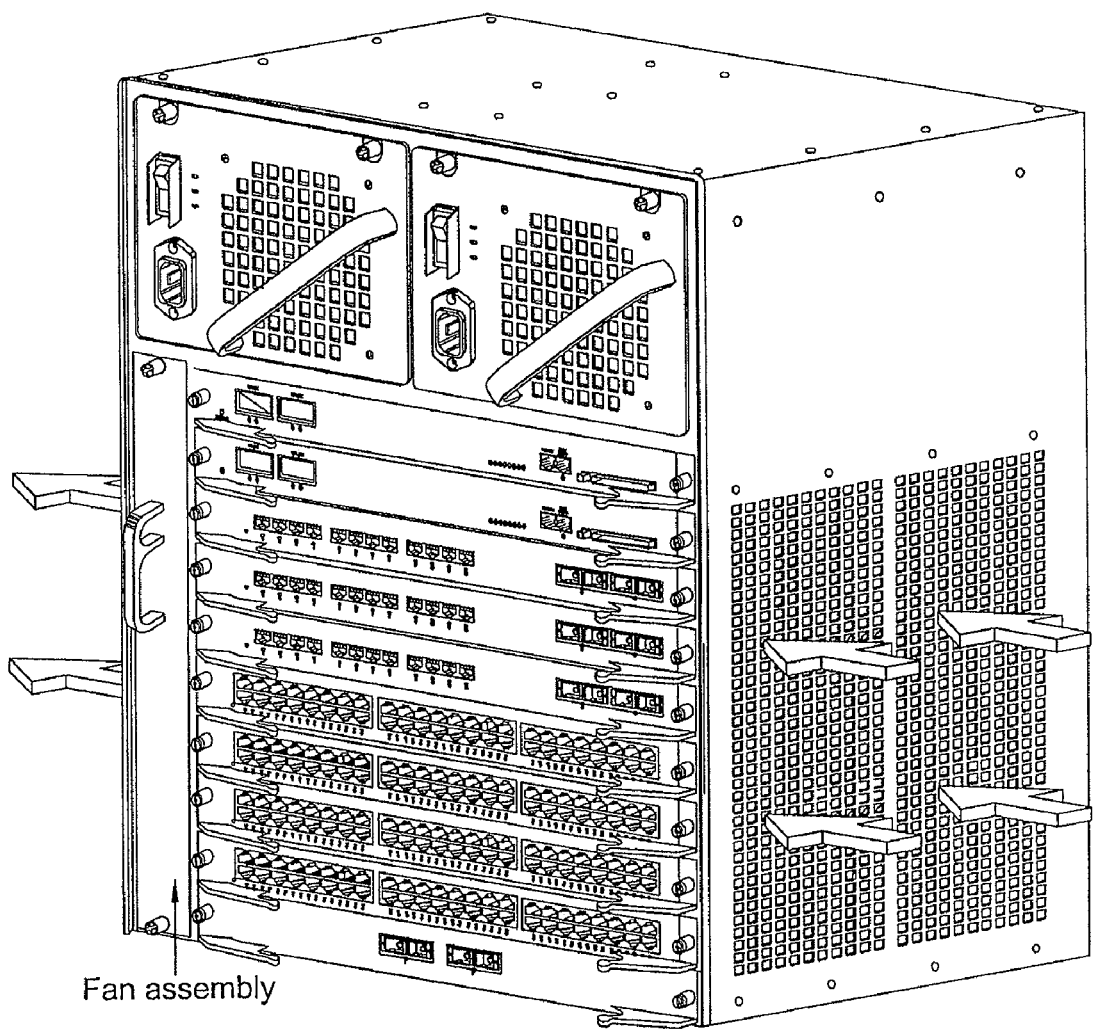
FIG. 10 is an isometric view of a switch device featuring side-to-side ventilation.

With reference to FIG. 4, an instance of a cable management rack is depicted in accordance with the present disclosure in the form of a rack 400. The rack 400 may encompass a tall, rectangular frame, and may include two uprights 402. The two uprights 402 may be attached to a base 404 at a bottom margin of the frame. The two uprights 402 may further be attached to a top member 406. The top member 406 may include a waterfall 408 for facilitating the formation of appropriately large bend radii in cables (not separately shown) mounted with respect to the rack 400. Each of the uprights 402 may include side panel 410. Each side panel 410 may include a plurality of vent holes 412 for facilitating the passage of air through the side panel 410, such that the rack 400 is operable as a component of a ventilation system for delivering an effective flow of cooling air to one or more heat generating devices (one of which is shown schematically in FIG. 4 at reference numeral 414) mounted in the rack 400 through the vent holes 412 of a side panel 410, and/or to promote an effective flow of warm exhaust air therefrom through the vent holes 412 of a side panel 410. In such circumstances, the rack 400 is a suitable rack for receiving heat-generating devices (e.g., such as the Catalyst WS-C4510R switch marketed by Cisco Systems, Inc., an illustration of which is provided in FIG. 10, and/or other switches marketed by Cisco Systems, such as the Catalyst WS-C6513, and/or switches marketed by other companies than Cisco, and/or one or more non-switch devices with side-to-side ventilation) configured to draw cooling air through a lateral side of the device 414 (e.g., as opposed to through a front panel of the device 414) adjacent one of the side panels 410, and to expel warm exhaust air through an opposite lateral side of the device 414 (e.g., as opposed to through a rear panel of the device) adjacent the other of the side panels 410. It is noted that while such a side-cooled and side-exhausted device 414 is entirely compatible with the rack 400, the same may not necessarily be as compatible with conventional cable management racks, predominant portions of the respective areas (i.e., height and breadth) of the side panels of the uprights of which tend to be intact and substantially unperforated, and may therefore be substantially impervious to the passage of cooling and/or exhaust air flows therethrough.

Specifically with respect to the embodiment shown in FIG. 4, the plurality of vent holes 412 may advantageously collectively extend across a predominant portion of the surface area (e.g., the height and breadth) of the side panel 410, and/or each of the vent holes may advantageously be of sufficiently large size relative to a thickness of the side panel 410, to allow the side panel 410 to offer a relatively low level of resistance to the passage of air through the side panel 410 consistent with the rack 400 being operable to deliver an effective flow of cooling air to the device 414 through the vent holes 412 of a side panel 410, and/or to eliminate an effective flow of exhaust air from the device 414 through the vent holes 412 of a side panel. As shown in FIG. 4, in accordance with embodiments of the present disclosure, the vent holes 412 may take the form of one or more regular or irregular arrays (e.g., one or more similarly configured regular or irregular arrays) comprising a plurality of such vent holes 412 and collectively representing a predominant portion (e.g., between about 50% to about 55%, between about 55% to about 60%, between about 60% to about 65%, between about 65% to about 70%, between about 70% to about 75%, between about 75% to about 80%, between about 80% to about 85%, and/or greater than about 85%) of the total area (e.g., the entire height and breadth/depth) of the side panel 410 of the respective upright 402. Other arrangements are possible, including embodiments wherein the vent holes 412 take the form of a regular array comprising a plurality of such vent holes 412 representing a predominant portion (e.g., between about 50% to about 55%, between about 55% to about 60%, between about 60% to about 65%, between about 65% to about 70%, between about 70% to about 75%, between about 75% to about 80%, between about 80% to about 85%, and/or greater than about 85%) of the total area (e.g., the entire height and breadth/depth) of a portion of the side panel 410 of the respective upright 402 (e.g., wherein the a portion in question of the side panel 410 represents between about 10% to about 15%, between about 15% to about 20%, between about 20% to about 25%, between about 25% to about 30%, between about 30% to about 35%, between about 35% to about 40%, between about 40% to about 45%, between about 45% to about 50%, between about 50% to about 55%, between about 55% to about 60%, between about 60% to about 65%, between about 65% to about 70%, between about 70% to about 75%, and/or between about 75% to about 80%, of the total area (e.g., the entire height and breadth/depth) of the side panel 410 of the respective upright 402).

As shown in FIG. 4, in accordance with embodiments of the present disclosure, the vent holes 412 may advantageously form one or more honeycomb-type arrays of hexagonal perforations through the side panel 410 as shown in FIG. 4, wherein the respective shapes of the array and the individual perforations may be beneficial for purposes of achieving relatively high structural rigidity while simultaneously permitting a relatively high proportion of the area (e.g., height and breadth/depth) covered by the respective arrays to be open and amenable to the unhindered passage through the upright 402 of respective flows of cooling and/or warm exhaust air with respect to the device 414 mounted therein. In accordance with other embodiments of the present disclosure, other shapes than a honeycomb shape may be provided for the array of vent holes 412, and/or other shapes than a hexagonal shape may be provided for the vent holes 412 themselves. For example, the vent holes 412 may be arranged in an regular array of columns and rows (e.g., vertical columns and horizontal rows), and/or the vent holes themselves may manifest other shapes (e.g., regular or irregular shapes, circles, rhombi, squares, rectangles, etc., or a combination thereof). Further, the vent holes 412 need not necessarily be punched holes, but may be formed using any number of conventional manufacturing techniques (e.g., via molding, machining, drilling, etc.), and need not necessarily provide a perpendicular and/or a straight path for air to pass through the upright 402 (e.g., may be oriented at an angle to the normal, and/or may be provided with one or more slanted and/or fixed and/or movable fins or vanes or louvers to influence the flow of air through the upright).

Figure 5:
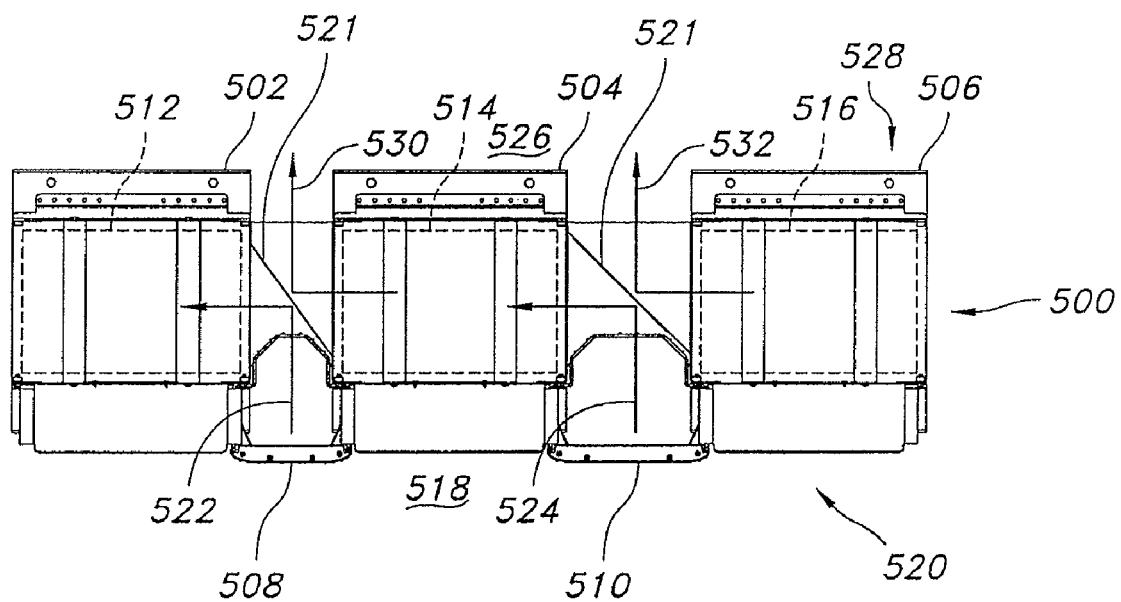
FIG. 5 is a schematic plan view of an arrangement in accordance with the present disclosure of cable management racks similar to the rack illustrated in FIG. 4, cable management cages mounted between and beside the racks, devices mounted with respect to the racks, and flow redirection baffles disposed in spaces between the racks, wherein the arrangement illustrates inventive flows for receiving cooling air from a corridor adjacent a front side of the arrangement and for discharging warm exhaust air from the mounted devices indirectly into a corridor adjacent a rear side of the arrangement.

Turning now to FIG. 5, an arrangement 500 in accordance with embodiments of the present disclosure includes multiple instances of a cable management rack similar to the rack 400 of FIG. 4, including a rack 502, a rack 504, and a rack 506, a cable management cage 508 disposed between the rack 502 and the rack 504, a cable management cage 510 disposed between the rack 504 and the rack 506, a side-cooled device 512 mounted in the rack 502, a side-cooled and side-exhausted device 514 mounted in the rack 504, and a side-exhausted device 516 mounted in the rack 506. A space or corridor 518 defined at least in part by a front side 520 of the arrangement 500 includes a supply of cool air for cooling at least the device 512 mounted in the rack 502, and the device 514 mounted in the rack 504. The arrangement 500 further includes multiple instances of a baffle 521 for redirecting respective flows of cooling and/or warm exhaust air flows. As shown by respective flows of cool air indicated at 522 and 524, the cooling air enters the devices 512, 514 via respective lateral sides of each such device 512, 514 after having been received from the front side 520 of the arrangement 500 adjacent the corridor 518 and redirected (e.g., redirected 90 degrees) by a respective instance of a baffle 521, such that the devices 512, 514 receive the flows 522, 524 only indirectly, rather than directly, through the front side 520 of the arrangement 500 adjacent the corridor 518. A space or corridor 526 is defined at least in part by a rear side 528 of the arrangement 500, and as shown by respective flows of warm exhaust air indicated at 530 and 532, respective flows of warm exhaust air exit the devices 514, 516 via respective lateral sides of each such device 514, 516, and are redirected (e.g., redirected 90 degrees) by respective instances of a baffle 521, such that the devices 514, 516 discharge the flows 530, 532 only indirectly, rather than directly, through the rear side 528 of the arrangement adjacent the corridor 526.

As those of ordinary skill will readily recognize, the present disclosure, and more particularly, the arrangement 500, is not necessarily limited to embodiments including cable management cages (e.g., such as the cable management cage 508 or the cable management cage 510). For example, in accordance with embodiments of the present disclosure, either or both of the cable management cage 508 and the cable management cage 510 may be removed, and/or substituted for by the use of any other suitable system or component capable of performing the function of vertical style wire management.

As shown in FIGS. 6, 7, 8, and 9, each of which illustrates a portion of a respective variation of the arrangement 500 of FIG. 5, each of the racks 502, 504, and 506 may include an upright 600 similar to the uprights 402 of FIG. 4, and may further include a perforated side panel 602. Each instance of a baffle 521 may be mounted against a side panel 602. One or more (or all) of the baffles 521 may include a cover 604 for preventing at least one of a flow of cooling air flow or a flow of warm exhaust air from extending beyond a certain distance vertically in the regions of the baffles 521 between the racks 502, 504, and 506 (e.g., to reduce and/or eliminate the intermingling of exhaust flows associated with respective side-cooled and/or side-exhausted devices resident in the same rack, and/or to reduce and/or eliminate the possibility that an exhaust flow from one side-cooled and/or side-exhausted device will back up into another such device resident in the same rack).

Figure 11:
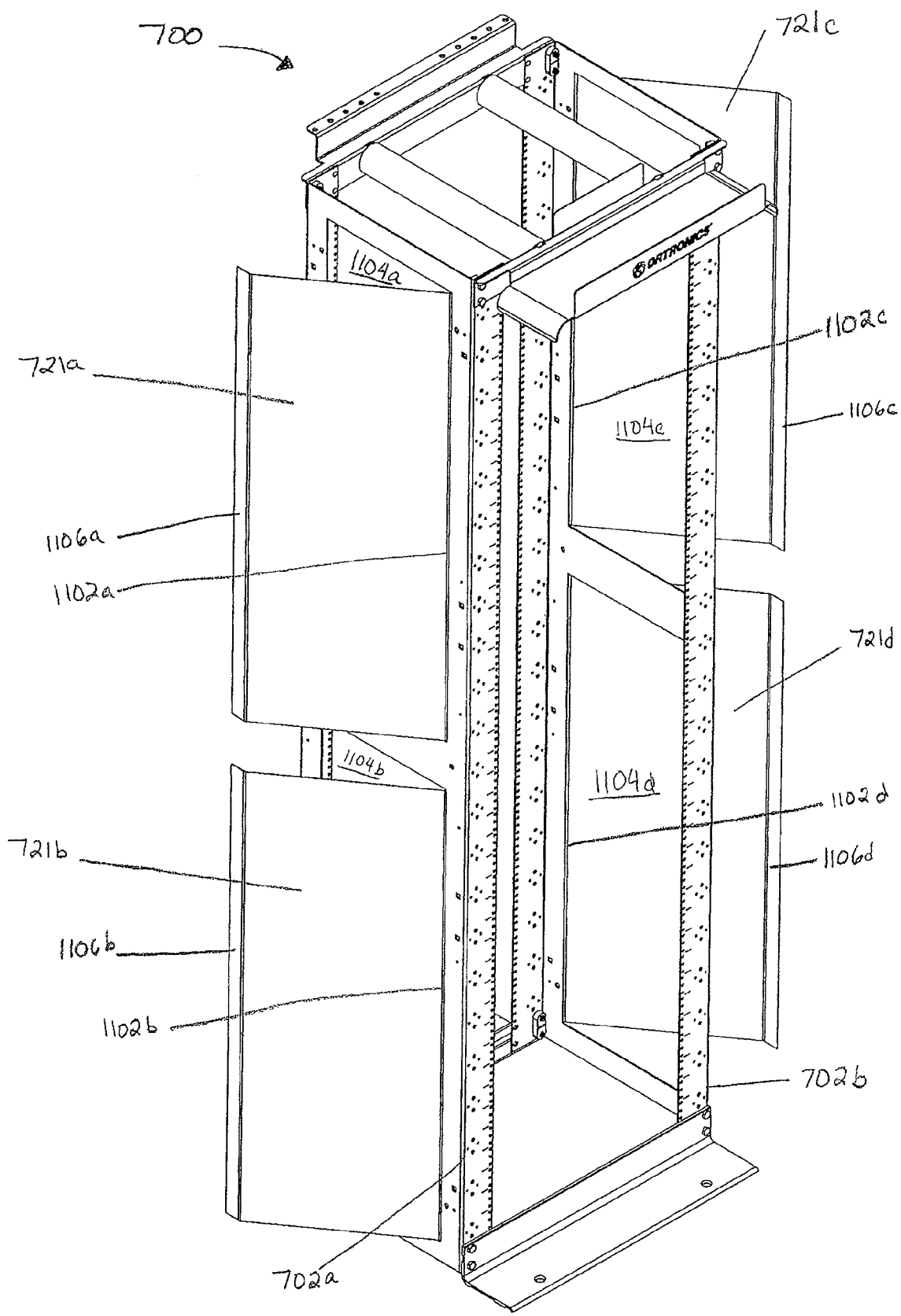
FIG. 11 is a perspective side view of a cable management rack incorporating respective uprights having integral baffles extending therefrom in accordance with an alternate embodiment of the present disclosure.

With reference to FIG. 11, an alternate rack embodiment is depicted in accordance with the present disclosure. In the exemplary embodiment of FIG. 11, rack 700 includes first and second uprights 702a, 702b. With initial reference to upright 702a, first and second vertically-spaced integral baffles 721a, 721b extend therefrom. Integral baffles 721a, 721b extend from upright 702a along vertically-oriented bend regions 1102a, 1102b, respectively. Of note, a substantially rectangular openings 1104a, 1104b are defined in the side face of rack 700 that substantially correspond in size to the total area of integral baffles 721a, 721b. This correspondence between rectangular openings 1104a, 1104b and integral baffles 721a, 721b arises because the integral baffles are generally formed through metal working of material initially filling the space of rectangular openings 1104a, 1104b. Integral baffles 721c, 721d extend from upright 702b relative to vertically-oriented bend regions 1102c, 1102d and generally correspond in area to the corresponding rectangular opening 1104c, 1104d defined in the side face of upright 702b.

Each of the integral baffles 721a-721d may advantageously define a vertically-oriented flange or lip 1106a-1106d along an exposed edge thereof. The flange/lip facilitates positioning of rack 700 relative to adjacent structures, e.g., adjacent racks, and is generally oriented substantially parallel to the side face of the corresponding upright. The disclosed flange(s)/lip(s) may include a plurality of apertures/slots (not pictured) that facilitate attachment to adjacent structures, e.g., adjacent racks. Of note, the angular orientations of integral baffles 721a-721d relative to the corresponding upright—which are defined by the angles formed in bend regions 1102a-1102d—may vary from implementation-to-implementation, but such angle typically ranges from about 30° to about 60°. The angular orientation of integral baffles 721a-721d advantageously facilitates sideways air flow into and out of rack 700. In the exemplary embodiment of FIG. 11, opposed integral baffles 721a, 721b and 721c, 721d extend from diagonally opposing regions of uprights 702a, 702b. In this way, entering air flow may be derived from a region in front of rack 700 and exiting air flow—which is heated—may be directed toward the rear of rack 700. However, it is also contemplated according to the present disclosure that opposed integral baffles may open in the same direction, e.g., toward the front or toward the rear, or that spaced In an alternate embodiment, not depicted, integral baffles of the type disclosed with reference to FIG. 11 may be associated with one upright of a rack, whereas non-integral baffle structures of the type disclosed with reference to FIGS. 5-9 may be associated with a second upright of a rack. Similarly, vented/apertured structures of the type disclosed with reference to FIGS. 4, 6, 7 and 9 may be associated with uprights that include either integral or non-integral baffles, as disclosed herein. Thus, as those of ordinary skill will readily recognize, the integral and non-integral baffles disclosed herein can be used with various rack designs.

Although the present disclosure has been described with reference to exemplary embodiments and implementations, it is to be understood that the present disclosure is neither limited by nor restricted to such exemplary embodiments and/or implementations. Rather, the present disclosure is susceptible to various modifications, enhancements and variations without departing from the spirit or scope of the present disclosure. Indeed, the present disclosure expressly encompasses such modifications, enhancements and variations as will be readily apparent to persons skilled in the art from the disclosure herein contained.

The invention claimed is:

1. A cable management rack, comprising:
    a. a vertical rectangular frame that includes a first upright and a second upright positioned on opposite sides thereof, and
    b. at least one integral baffle that defines a baffle height and a baffle width, said at least one integral baffle extending from said first upright along a vertically oriented bend region, said at least one integral baffle being angularly oriented with respect to said first upright;
    wherein said first upright defines an opening in a side face thereof that corresponds in height and width to the baffle height and the baffle width, respectively.

2. A cable management rack according to claim 1, wherein said opening is a substantially rectangular opening adjacent said at least one integral baffle, and wherein an area of said substantially rectangular opening substantially corresponds to the area of said at least one integral baffle.

3. A cable management rack according to claim 1, wherein said at least one integral baffle defines a lip or flange along an exposed edge thereof.

4. A cable management rack according to claim 3, wherein said lip or flange is substantially parallel to said side face of said first upright.

5. A cable management system operable to deliver a supply of cooling air to a heat generating device mounted therewithin, the system comprising:
    a cable management rack for accommodating the heat-generating device, the cable management rack encompassing:
        i. a vertical rectangular frame that includes a first upright and a second upright positioned on opposite sides of the vertical rectangular frame;
        ii. a first integral baffle that defines a first baffle height and a first baffle width, said first integral baffle extending from said first upright along a first vertically oriented bend region, said first integral baffle being configured and dimensioned to redirect a rearward flow of cool air from a front space adjacent to a front side of the vertical rectangular frame sideways through a first opening in a side face of the first upright; and
        iii. a second integral baffle that defines a second baffle height and a second baffle width, said second integral baffle extending from said second upright along a second vertically oriented bend region, said second integral baffle being configured and dimensioned to redirect a sideways flow of exhaust air from the vertical rectangular frame and through a second opening in a side face of the second upright rearward into a rear space adjacent a rear side of the vertical rectangular frame;
    wherein said first opening in said side face of the first upright corresponds in height and width to the first baffle height and the first baffle width, respectively; and
    wherein said second opening in said side face of the second upright corresponds in height and width to the second baffle height and the second baffle width, respectively.

6. A cable management system according to claim 5, further comprising:
    a. a third integral baffle extending from the first upright in vertical arrangement with the first integral baffle and configured and dimensioned to redirect a second, separate rearward flow of cool air from the front space adjacent the front side of the vertical rectangular frame sideways through the first upright; and
    b. a fourth integral baffle extending from the second upright in vertical arrangement with the second integral baffle and configured and dimensioned to redirect a second, separate sideways flow of exhaust air from the vertical rectangular frame and through the second upright rearward into the rear space adjacent the rear side of the vertical rectangular frame.

7. A cable management system according to claim 5, further comprising:
    a. a second cable management rack for accommodating a second heat-generating device, the second cable management rack encompassing a second vertical rectangular frame open in a front and a rear of the second vertical rectangular frame and including third and fourth uprights attached to opposite respective lateral sides of a base and a top member;
    b. a third cable management rack for accommodating a third heat-generating device, the third cable management rack encompassing a third vertical rectangular frame open in a front and a rear of the third vertical rectangular frame and including fifth and sixth uprights attached to opposite respective lateral sides of a second base and a second top member;
    c. wherein the first integral baffle is further extending from the fourth upright of the second cable management rack and is configured and dimensioned to redirect a second sideways flow of exhaust air through the fourth upright thereof rearward into the rear space adjacent a rear side of the second vertical rectangular frame; and
    d. wherein the second integral baffle is further extending from the fifth upright of the third cable management rack and is configured and dimensioned to redirect a second rearward flow of cool air from the front space adjacent a front side of the third rectangular frame sideways through the fifth upright of the third cable management rack.

* * * * *